United States Patent
Terada et al.

(10) Patent No.: US 6,714,390 B2
(45) Date of Patent: Mar. 30, 2004

(54) GIANT MAGNETO-RESISTIVE EFFECT ELEMENT, MAGNETO-RESISTIVE EFFECT TYPE HEAD, THIN-FILM MAGNETIC MEMORY AND THIN-FILM MAGNETIC SENSOR

(75) Inventors: Shoji Terada, Kanagawa (JP); Atsushi Matsuzono, Kanagawa (JP); Hiroaki Ono, Miyagi (JP)

(73) Assignee: Sony Corporation, Tokyo (JP)

( * ) Notice: Subject to any disclaimer, the term of this patent is extended or adjusted under 35 U.S.C. 154(b) by 159 days.

(21) Appl. No.: 10/120,741

(22) Filed: Apr. 11, 2002

(65) Prior Publication Data

US 2002/0172840 A1 Nov. 21, 2002

(30) Foreign Application Priority Data

Apr. 16, 2001 (JP) .................................... P2001-117108

(51) Int. Cl.$^7$ ................................................ G11B 5/39
(52) U.S. Cl. ................................................ 360/324.12
(58) Field of Search .......................... 360/324.1–324.12

(56) References Cited

U.S. PATENT DOCUMENTS 5,549,978 A * 8/1996 Iwasaki et al. ............. 428/692

* cited by examiner

*Primary Examiner*—A. J. Heinz
(74) *Attorney, Agent, or Firm*—Sonnenschein, Nath & Rosenthal LLP

(57) ABSTRACT

A giant magneto-resistive effect element (1) comprises a lamination layer film (2) including a ferromagnetic film and wherein a nonmagnetic film and an antiferromagnetic film, the ferromagnetic film includes a magnetization free layer (13) and a magnetization fixed layer, a current is restricted by an upper electrode and a lower electrode in such a manner that the current may flow in the direction perpendicular to the film plane of the lamination layer film (2), the lamination layer film (2) is laminated including a high-resistance layer (21), a hard magnetic film (3) made of a conductive hard magnetic material and an insulating layer (4) are directly bonded to respective outsides of this lamination layer film (2) along its width direction and this hard magnetic film (3) is shifted from the high-resistance layer (21) and bonded near the magnetization free layer (13). A magneto-resistive effect type head, a thin-film magnetic memory and a thin-film magnetic sensor include the giant magneto-resistive effect element (1). The giant magneto-resistive effect element can obtain a high output, a high resistance and is able to cope with high recording density. Also, the magneto-resistive effect head, the thin-film magnetic memory and the thin-film magnetic sensor may include this giant magneto-resistive effect element.

4 Claims, 5 Drawing Sheets

GIANT MAGNETO-RESISTIVE EFFECT ELEMENT, MAGNETO-RESISTIVE EFFECT TYPE HEAD, THIN-FILM MAGNETIC MEMORY AND THIN-FILM MAGNETIC SENSOR

RELATED APPLICATION DATA

The present application claims priority to Japanese Application(s) No(s). P2001-117108 filed Apr. 16, 2001, which application(s) is/are incorporated herein by reference to the extent permitted by law.

BACKGROUND OF THE INVENTION

1. Field of the Invention

The present invention relates to a giant magnetoresistive effect element and also relates to a magnetoresistive effect type head, a thin-film magnetic memory and a thin-film magnetic sensor, each of which includes this giant magneto-resistive effect element.

2. Description of the Related Art

A so-called merge type combined magnetic head, which results from combining an induction type write magnetic head and a read magnetic head using a magneto-resistive effect (i.e., magneto-resistive effect type head), is employed as a high-density magnetic recording device such as a hard disk drive at present.

As a magneto-resistive effect element (MR element) for use in a magneto-resistive effect type head comprising a read magnetic head located on the lower layer of the combined magnetic head, there has recently been employed a giant magneto-resistive effect element (GMR element) having higher sensitivity.

A GMR element, which is now commercially available on the market, is used in the mode called a "CIP" (Current In Plane) mode in which a sense current for sensing a magneto-resistive effect flows in the direction parallel to a film plane of a lamination layer film of a GMR element.

In the magnetic heads for use as a HDD (hard disk drive), there is the main stream in which a magneto-resistive effect type head including upper and lower shields on the CIP element operable in this CIP mode is used as a read magnetic head of a lower layer.

In order to achieve a recording density higher than 100 gigabits/inch$^2$, a magneto-resistive effect element has to have a high linear density so that the magneto-resistive effect element has to be microminiaturized much more.

However, according to the CIP type MR element which is used in the above-mentioned CIP mode, it becomes more difficult to dispose a GMR element between the upper and lower shield films having a film thickness of less than 100 nanometers while the upper and lower shield films and the GMR element are being insulated from each other.

So far it has been examined that a CPP type GMR element, which is used in the mode called a "CPP" (Current Perpendicular to the Plane) in which a sense current flows in the direction perpendicular to a film plane of a lamination layer film of a GMR element and a CPP type TMR (tunneling magneto-resistive effect) element are used as the MR element.

Since the CPP type GMR element uses the shield films as electrodes, the shield films and the GMR element need not be insulated from each other. Hence, the above-mentioned problem of the insulation between the upper and lower shield films and the GMR element can be solved basically.

Further, because the CPP type GMR element has an increased area in which it comes in contact with an electrode film made of a metal film having an excellent thermal conductivity, the CPP type GMR element has a characteristic in which an electromigration is difficult to occur therein at a remarkably high current density as compared with the CIP type GMR element. Therefore, it is considered that the CPP type GMR element is able to realize a narrow magnetic gap and a narrow track width which are the requirements of the high-density recording magnetic head.

When the MR element is used in the magneto-resistive effect type head, the MR element has the upper limit of the resistance value from viewpoints of a thermal noise, an ESD (Electric Static Discharge), a resonance in a read IC and a write IC and so forth. Further, the MR element has the lower limit of the resistance value from a viewpoint of an output.

Then, in the area in which the recording density falls in a range of from 100 to 200 gigabits/inch$^2$, when the CPP type TMR element is used as the MR element, the resistance of the MR element has to be decreased. When the CPP type GMR element is used as the MR element, the resistance of the MR element has to be increased.

In order to increase the resistance of the CPP type GMR element, it is proposed that a high resistance layer should be inserted into the lamination layer film of the GMR element, for example.

However, when the high resistance layer is inserted into the lamination layer film of the GMR element as described above, if a hard magnetic material having a conductivity, such as a metal is used as a hard film (hard magnetic film) to stabilize the magnetization of the GMR element, then a sense current is shunted into the hard film so that a current, which is flowing through the GMR element, is decreased. There then arises a problem that the output of the GMR element is lowered.

For this reason, in order to insulate the GMR element and the hard film from each other, there can be considered a configuration in which a GMR element and a hard film are bonded to each other through an insulating material or a configuration in which an insulating or high-resistance hard magnetic material is used as a hard film.

However, from a view point of the cost of a material, it is to be desired that a hard magnetic material having a conductivity, which can be manufactured comparatively inexpensively, should be used as a hard film. Furthermore, in order to sufficiently stabilize a magnetization of a magnetization free layer of a GMR element, it is to be desired that the hard film should directly be bonded to the GMR element.

SUMMARY OF THE INVENTION

In view of the aforesaid aspect, it is an object of the present invention to provide a giant magneto-resistive effect element capable of producing a high output and a high resistance and which can cope with a high recording density and a magneto-resistive effect type head, a thin-film magnetic memory and a thin-film magnetic sensor, each of which includes this giant magneto-resistive effect element.

According to an aspect of the present invention, there is provided a giant magneto-resistive effect element comprising a lamination layer film including a ferromagnetic film, a nonmagnetic film and an antiferromagnetic film and in which the ferromagnetic film includes a magnetization free layer and a magnetization fixed layer and a current is restricted by an upper electrode and a lower electrode so that the current flows to the direction perpendicular to the film plane of the lamination layer film, wherein the lamination layer film is laminated including a high-resistance layer, a hard magnetic film made of a conductive hard magnetic material and an insulating layer are directly bonded to respective outsides of the lamination layer film along its width direction and the hard magnetic film is shifted from the high-resistance layer and bonded nearer the magnetization free layer.

According to another aspect of the present invention, there is provided a magneto-resistive effect type head including a giant magneto-resistive effect element comprising a lamination layer film including a ferromagnetic film, a nonmagnetic film and an antiferromagnetic film, the ferromagnetic film includes a magnetization free layer and a magnetization fixed layer and a current is restricted by an upper electrode and a lower electrode so that the current flows to the direction perpendicular to the film plane of the lamination layer film, the lamination layer film is laminated including a high-resistance layer, a hard magnetic film made of a conductive hard magnetic material and an insulating layer are directly bonded to respective outsides of the lamination layer film along its width direction and the hard magnetic film is shifted from the high-resistance layer and bonded nearer the magnetization free layer, wherein upper and lower magnetic shields are disposed so as to sandwich the giant magneto-resistive effect element through a gap film made of a nonmagnetic conductive material, the gap film and the magnetic shields constitute the upper electrode and the lower electrode and the upper electrode, the lower electrode and the lamination layer film are connected to each other electrically.

In accordance with further another aspect of the present invention, there is provided a thin-film magnetic memory including a bit line, a word line and a giant magneto-resistive effect element comprising a lamination layer film including a ferromagnetic film, a nonmagnetic film and an antiferromagnetic film and in which the ferromagnetic film includes a magnetization free layer and a magnetization fixed layer and a current is restricted by an upper electrode and a lower electrode so that the current flows to the direction perpendicular to the film plane of the lamination layer film, the lamination layer film is laminated including a high-resistance layer, a hard magnetic film made of a conductive hard magnetic material and an insulating layer are directly bonded to respective outsides of the lamination layer film along its width direction and the hard magnetic film is shifted from the high-resistance layer and bonded nearer the magnetization free layer, wherein a memory cell including the giant magneto-resistive effect element is disposed so as to oppose to a crossing between the bit line and the word line.

In accordance with a further aspect of the present invention, there is provided a thin-film magnetic sensor including a giant magneto-resistive effect element comprising a lamination layer film including a ferromagnetic film, a nonmagnetic film and an antiferromagnetic film, the ferromagnetic film includes a magnetization free layer and a magnetization fixed layer and a current is restricted by an upper electrode and a lower electrode so that the current flows to the direction perpendicular to the film plane of the lamination layer film, the lamination layer film is laminated including a high-resistance layer, a hard magnetic film made of a conductive hard magnetic material and an insulating layer are directly bonded to respective outsides of the lamination layer film along its width direction and the hard magnetic film is shifted from the high-resistance layer and bonded nearer the magnetization free layer, wherein upper and lower magnetic shields are disposed so as to sandwich the giant magneto-resistive effect element through a gap film made of a nonmagnetic conductive material, the gap film and the magnetic shields constitute the upper electrode and the lower electrode and the upper electrode, the lower electrode and the lamination layer film are connected to each other electrically.

According to the arrangement of the above giant magneto-resistive effect element of the present invention, since the lamination layer film is laminated including the high-resistance layer and the resistance of the lamination layer film of the giant magneto-resistive effect element can be increased by the high-resistance layer, this giant magneto-resistive effect element becomes able to cope with high recording density.

Further, since the hard magnetic film and the insulating layer are directly connected to the respective outsides of the lamination layer film and this hard magnetic film is shifted from this high-resistance layer and bonded nearer the magnetization free layer, the insulating layer is directly bonded to at least part of the high-resistance layer, i.e., the opposite side of the magnetization free layer, and the current can be prevented from being shunted to the hard magnetic film by this insulating layer so that the current can flow in the high-resistance layer. Thus, the output can be prevented from being lowered by the loss of the current shunted and this giant magneto-resistive effect element can obtain a high output. Moreover, since the loss of the shunted current is restrained and the current flows in the high-resistance layer, it is possible to increase the effective resistance of the lamination layer film relative to the current.

Furthermore, since the hard magnetic film is directly bonded to the magnetization free layer, the magnetic field from the hard magnetic film strongly acts on the magnetization free layer with the result that the magnetization direction of the magnetization free layer can be stabilized. As a consequence, the operation, i.e., resistance change of the giant magneto-resistive effect element can be stabilized.

According to the arrangement of the above-mentioned magneto-resistive effect type head of the present invention, since this magneto-resistive effect type head includes the above giant magneto-resistive effect element, the output can be restrained from being lowered due to the loss of the shunted current and the high output can be obtained. Therefore, there can be configured the magneto-resistive effect type head which can increase its output. Furthermore, it is possible to decrease the sense current necessary for obtaining the same output.

Further, according to the arrangement of the above-mentioned thin-film magnetic memory of the present invention, since the memory cell includes the above-described giant magneto-resistive effect element of the present invention, the output can be restrained from being lowered due to the loss of the shunted current and the giant magneto-resistive effect element can produce the high output. Thus, even when the amount of the current flowing in the word line and the bit line, for example, is decreased as compared with the related art, it becomes possible to write or read information in or out of the memory cell in this thin-film magnetic memory.

According to the arrangement of the above-mentioned thin-film magnetic sensor of the present invention, since this thin-film magnetic sensor includes the above-described giant magneto-resistive effect element of the present invention, the output due to the loss of the shunted current can be restrained from being lowered and the high output can be obtained. Thus, even when the change of the external magnetic field is small, it is possible to configure the thin-film magnetic sensor which can produce the high output. Furthermore, it is possible to reduce the sense current necessary for obtaining the same output.

DESCRIPTION OF THE PREFERRED EMBODIMENTS

Figure 1A:
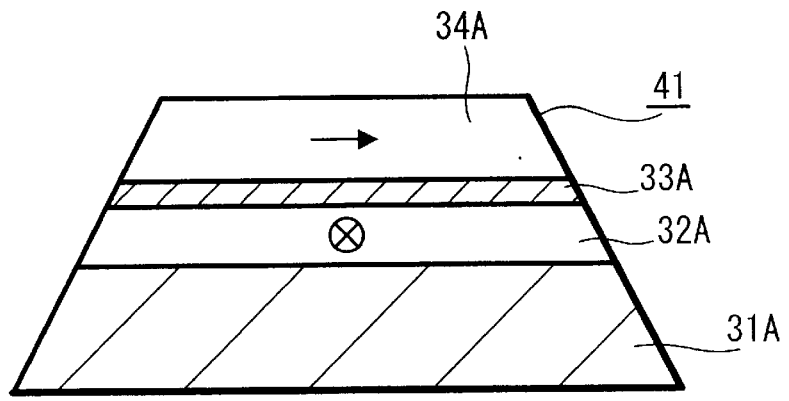
FIG. 1A is a cross-sectional view showing a bottom spin type GMR element.

Prior to describing the preferred embodiments of the present invention in detail, let us now summarize the gist of the present invention as follows.

The present invention relates to a giant magneto-resistive effect element comprising a lamination layer film including a ferromagnetic film, a nonmagnetic film and an antiferromagnetic film and in which the ferromagnetic film includes a magnetization free layer and a magnetization fixed layer and a current is restricted by an upper electrode and a lower electrode so that the current flows to the direction perpendicular to the film plane of the lamination layer film, wherein the lamination layer film is laminated including a high-resistance layer, a hard magnetic film made of a conductive hard magnetic material and an insulating layer are directly bonded to respective outsides of the lamination layer film along its width direction and the hard magnetic film is shifted from the high-resistance layer and bonded nearer the magnetization free layer.

The present invention relates to a magneto-resistive effect type head including a giant magneto-resistive effect element comprising a lamination layer film including a ferromagnetic film, a nonmagnetic film and an antiferromagnetic film, the ferromagnetic film includes a magnetization free layer and a magnetization fixed layer and a current is restricted by an upper electrode and a lower electrode so that the current flows to the direction perpendicular to the film plane of the lamination layer film, the lamination layer film is laminated including a high-resistance layer, a hard magnetic film made of a conductive hard magnetic material and an insulating layer are directly bonded to respective outsides of the lamination layer film along its width direction and the hard magnetic film is shifted from the high-resistance layer and bonded nearer the magnetization free layer, wherein upper and lower magnetic shields are disposed so as to sandwich the giant magneto-resistive effect element through a gap film made of a nonmagnetic conductive material, the gap film and the magnetic shields constitute the upper electrode and the lower electrode and the upper electrode, the lower electrode and the lamination layer film are connected to each other electrically.

Further, the present invention relates to a thin-film magnetic memory including a bit line, a word line and a giant magneto-resistive effect element comprising a lamination layer film including a ferromagnetic film, a nonmagnetic film and an antiferromagnetic film and in which the ferromagnetic film includes a magnetization free layer and a magnetization fixed layer and a current is restricted by an upper electrode and a lower electrode so that the current flows to the direction perpendicular to the film plane of the lamination layer film, the lamination layer film is laminated including a high-resistance layer, a hard magnetic film made of a conductive hard magnetic material and an insulating layer are directly bonded to respective outsides of the lamination layer film along its width direction and the hard magnetic film is shifted from the high-resistance layer and bonded nearer the magnetization free layer, wherein a memory cell including the giant magneto-resistive effect element is disposed so as to oppose to a crossing between the bit line and the word line.

Furthermore, the present invention relates to a thin-film magnetic sensor including a giant magneto-resistive effect element comprising a lamination layer film including a ferromagnetic film, a nonmagnetic film and an antiferromagnetic film, the ferromagnetic film includes a magnetization free layer and a magnetization fixed layer and a current is restricted by an upper electrode and a lower electrode so that the current flows to the direction perpendicular to the film plane of the lamination layer film, the lamination layer film is laminated including a high-resistance layer, a hard magnetic film made of a conductive hard magnetic material and an insulating layer are directly bonded to respective outsides of the lamination layer film along its width direction and the hard magnetic film is shifted from the high-resistance layer and bonded nearer the magnetization free layer, wherein upper and lower magnetic shields are disposed so as to sandwich the giant magneto-resistive effect element through a gap film made of a nonmagnetic conductive material, the gap film and the magnetic shields constitute the upper electrode and the lower electrode and the upper electrode, the lower electrode and the lamination layer film are connected to each other electrically.

Giant magneto-resistive effect elements (GMR elements) are roughly classified into a bottom spin type giant magneto-resistive effect element and a top spin type giant magneto-resistive effect element based upon the position at which a ferromagnetic film is disposed within a lamination layer film.

FIG. 1A is a cross-sectional view showing a bottom spin type giant magneto-resistive effect element according to the present invention.

As shown in FIG. 1A, in a bottom spin type GMR element 41, an antiferromagnetic film 31A is disposed at the lowermost layer of the lamination layer film. A ferromagnetic film 32A is disposed on the antiferromagnetic film 31A and of which the magnetization direction is fixed to the direction perpendicular to the sheet of the drawing by the antiferromagnetic layer 31A, thereby being served as a magnetization fixed layer.

A ferromagnetic film 34A is disposed on the magnetization fixed layer 32A through a nonmagnetic conductive film 33A. This ferromagnetic film 34A is served as a magnetization free layer of which the magnetization direction is changed in response to an external magnetic field such as a magnetic field of a signal from a recording medium. As described above, in the bottom spin type GMR element, the magnetization free layer 34A is disposed at the uppermost layer of the lamination layer film.

Figure 1B:
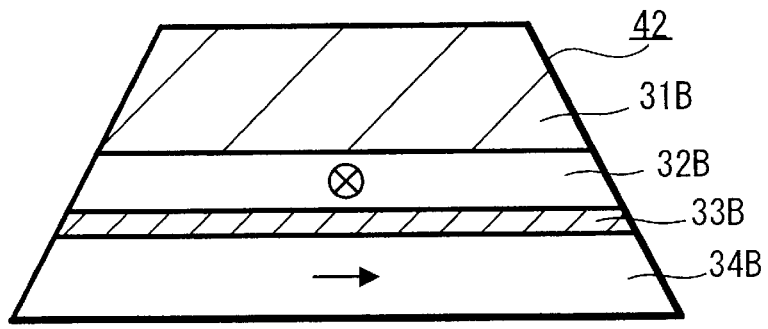
FIG. 1B is a cross-sectional view showing a top spin type GMR element.

FIG. 1B is a schematic cross-sectional view showing a top spin type giant magneto-resistive effect element according to the present invention.

As shown in FIG. 1B, in a top spin type GMR element 42, a ferromagnetic film, which serves as a magnetization fixed layer 32B, is deposited on a magnetization free layer 34B through a nonmagnetic conductive film 33B and an antiferromagnetic film 31B is deposited on the magnetization fixed layer 32B. Specifically, in the lamination layer film of the top spin type GMR element 42, the respective films are laminated in reverse order to that of the bottom spin type GMR element 41, and the magnetization free layer 34B is disposed at the lowermost layer of the lamination layer film.

Further, there has been so far proposed a dual spin type GMR element having a configuration in which a bottom spin type GMR element and a top spin type GMR element are combined with each other.

Figure 1C:
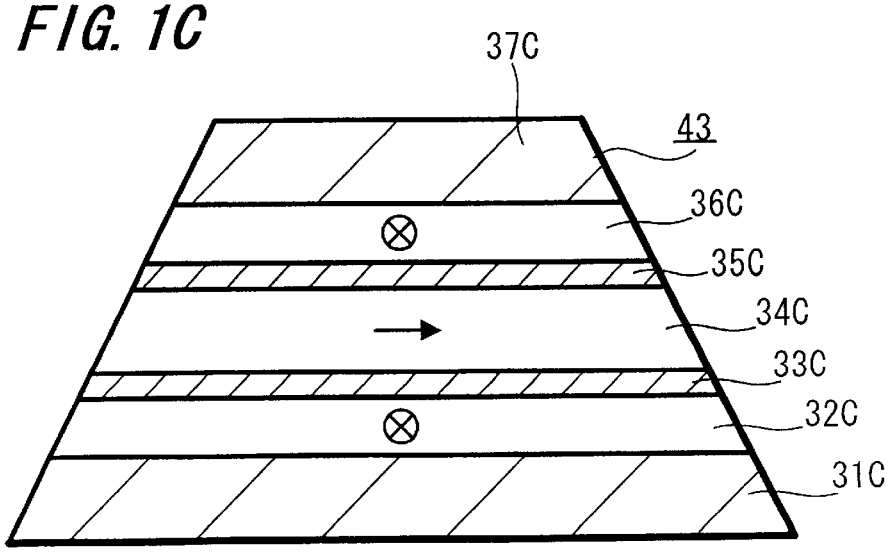
FIG. 1C is a cross-sectional view showing a dual spin type GMR element.

FIG. 1C is a schematic cross-sectional view of a dual spin type GMR element. As shown in FIG. 1C, in a dual spin type GMR element 43, two magnetization fixed layers 32C and 36C are respectively disposed in the lower and upper direction through nonmagnetic conductive films 33c and 35c across a magnetization free layer 34c disposed at a central portion of a lamination layer film, and antiferromagnetic films 31c and 37c are disposed at the upper most layer and the lowermost layer of the lamination layer film.

A giant magneto-resistive effect element according to the present invention can be applied to any one of the bottom spin type GMR element 41, the top spin type GMR element 42 and the dual spin type GMR element 43 shown in FIGS. 1A, 1B and 1C.

Embodiments of the present invention in which the giant magneto-resistive effect element according to the present invention is applied to the GMR elements of the respective types will be described below.

Figure 2:
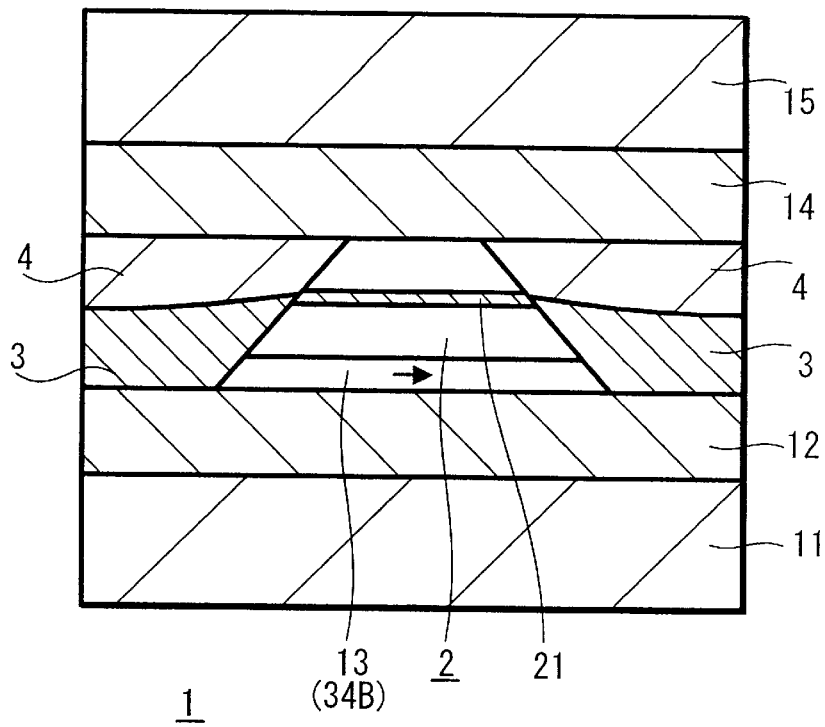
FIG. 2 is a schematic cross-sectional view showing a CPP type GMR element according to an embodiment of the present invention.

FIG. 2 is a schematic cross-sectional view illustrating a CPP type GMR element according to an embodiment of the present invention. As shown in FIG. 2, a GMR element includes upper and lower magnetic shields similarly to the case in which the giant magneto-resistive effect element is applied to a magneto-resistive effect type head or a thin-film magnetic sensor.

As illustrated, in this CPP type GMR element 1, a GMR element 2 is deposited on a lower magnetic shield 11 made of a magnetic material through a lower gap film 12 made of a nonmagnetic conductive material and which serves as an electrode film as well.

This GMR element 2 is a giant magneto-resistive effect element in which the present invention is applied to the top spin type GMR element 42 shown in FIG. 1B. The GMR element 2 is comprised of the lamination layer film including the ferromagnetic films (the magnetization fixed layer 32B and the magnetization free layer 34B) and the nonmagnetic film (the nonmagnetic conductive film) 33B and has a trapezoid-like shape (so-called abutment-like shape). Then, a magnetization free layer 13 corresponding to the magnetization free layer 34B shown in FIG. 1B is disposed at the lowermost layer of the GMR element 2.

On the right and left of the magnetization free layer 13 of the GMR element 2, a hard magnetic film (hard film) 3 made of a hard magnetic material having a conductivity is disposed so as to be directly connected to the magnetization free layer 13.

An insulating layer 4 is deposited on the hard magnetic film 3, and an upper magnetic shield 15 made of a magnetic material is disposed on the GMR element 2 and the insulating layer 4 through an upper gap film 14 made of a nonmagnetic conductive material. The upper gap film 14 serves as an electrode film as well and is electrically interconnected to the upper surface of the GMR element 2.

The lower magnetic shield 11 and the upper magnetic shield 15 are adapted to limit a magnetic field which is to be introduced into the GMR element 2. The lower and upper magnetic shields 11 and 15 can be made of NiFe, FeN and so forth.

The lower gap film 12 and the upper gap film 14 made of the nonmagnetic conductive material are adapted to separate the upper and lower magnetic shields 11 and 15 and the GMR element 2 magnetically. The upper and lower gap films 12 and 14 can be made of Au, Cu, Ta and so forth, for example.

Then, the lower magnetic shield 11 and the lower gap film 12 serve as the lower electrode, and the upper magnetic shield 15 and the upper gap film 14 serve as the upper electrode. Through these electrodes, a sense current, which is in the direction perpendicular to the film plane direction of the lamination layer film, can flow to the GMR element 2, thereby resulting in the CPP type GMR element 1 being configured.

When a magnetic field in the GMR element 2 is changed, an electrical resistance of the GMR element 2 is changed in response to the change of the magnetic field of the GMR element. At that very moment, while a sense current is flowing to the GMR element 2, a resistance change can be detected as an output. Further, the hard magnetic film (hard film) 3 is used to control the magnetization direction of the magnetization free layer 13 of the GMR element 2 so that the GMR element can be stabilized magnetically.

In the CPP type GMR element 1 according to this embodiment, the lamination layer film of the GMR element 2, in particular, includes a high-resistance layer 21. This high-resistance layer 21 is disposed above the magnetization free layer 13.

Specifically, the high-resistance layer 21 is disposed between the antiferromagnetic film 31B of the uppermost layer of the top spin type GMR element 42 and the magnetization free layer 34B of the lowermost layer. For example, the high-resistance layer 21 is disposed between the antiferromagnetic film 31 and the magnetization fixed layer 32B or the high-resistance layer 21 is disposed between the magnetization fixed layer 32B and the nonmagnetic film 33B.

A boundary surface between the hard magnetic film 3 and the insulating layer 4 disposed right and left of the GMR element 2 is bonded to the lamination layer film of the GMR element 2 in somewhere in the high-resistance layer 21.

Since the lamination layer film of the GMR element 2 includes the high-resistance layer 21 as described above, the resistance of the GMR element 2 can be increased as earlier mentioned and therefore the giant magneto-resistive effect element according to this embodiment becomes able to cope with high recording density which exceeds 100 gigabits/inch$^2$.

Further, since the boundary surface between the hard magnetic film 3 and the insulating layer 4 is bonded to somewhere in the high-resistance layer 21 so that at least part of the high-resistance layer 21 is sandwiched at its respective sides by the insulating layer 4, the sense current is restricted by the insulating layer 4 and thereby allowed to flow through the high-resistance layer 21. As a consequence, it is possible to solve a problem in which a current is shunted and lost when a high-resistance layer is provided within a lamination layer film of a GMR element.

While the boundary surface between the hard magnetic film 3 and the insulating layer 4 is bonded to somewhere in the high-resistance layer 21 so that the hard magnetic film 3 is bonded to part of the high-resistance layer 21 as described above, the present invention is not limited to the above-mentioned embodiment and the boundary surface between the hard magnetic film 3 and the insulating layer 4 may further be shifted in the lower direction such that the insulating layer 4 may be bonded to the whole of the high-resistance layer 21.

Stated otherwise, the hard magnetic film 3 may be shifted from the high-resistance layer 21 and bonded much to the magnetization free layer 13, whereby the path of the sense current may be confined within the high-resistance layer 21.

According to the above-mentioned embodiment of the present invention, since the hard magnetic film 3 is shifted from the high-resistance layer 21 and bonded much to the magnetization free layer 13, at least part of the high-resistance layer 21 is sandwiched at its left and right sides by the insulating layer 4 and the path of the sense current is restricted by the insulating layer 4 so that the sense current can flow through the high-resistance layer 21.

As a consequence, the current can be restrained from being shunted and lost in the high-resistance layer 21, the output based upon the resistance change can be increased, and an effective resistance of the GMR element 2 can be increased.

Therefore, according to the embodiment of the present invention, there can be realized the high-output CPP type GMR element 1. At the same time, the resistance of the GMR element 2 can be increased and the CPP type GMR element 1 becomes able to cope with the high recording density which exceeds 100 gigabits/inch$^2$.

Since the current is restrained from being shunted and lost in the high-resistance layer 21 by the right and left insulating layers 4 of the high-resistance layer 21, the hard magnetic film 3 made of the conductive hard magnetic material can directly be connected to the magnetization free layer 13. As a result, the hard magnetic film 3 can be approached to the magnetization free layer 13 so that the magnetization of the magnetization free layer 13 can be stabilized more effectively.

Furthermore, since the insulating film need not be formed between the hard magnetic film 3 and the GMR element 2, a process for forming this insulating film can be omitted and hence a manufacturing process can be simplified. Moreover, there can be used the conductive hard magnetic material which is inexpensive and popular as compared with a high-resistance hard magnetic material.

In the CPP type GMR element 1 according to the embodiment of the present invention, when the configuration in which the above-mentioned boundary surface between the hard magnetic film 3 and the insulating layer 4 is bonded to somewhere in the high-resistance layer 21 is manufactured, the range in which the lamination layer film of the GMR element 2 and the hard magnetic film 3 are bonded to each other can be controlled by using a suitable means such as a method of a manufacturing process for forming the so-called abutment-like shape of the GMR element 2.

For example, by combining conditions of a shape of a resist which serves as a mask used in ion beam etching to form the abutment-like shape, an incident angle at which an ion beam becomes incident on the substrate and an incident angle at which sputtering particles bombards the substrate to deposit the hard magnetic film 3 by sputtering, the boundary surface between the hard magnetic film 3 and the insulating layer 4 can be shifted from somewhere in the high-resistance layer 21 and bonded to a desired position nearer the magnetization free layer 13.

Next, a CPP type GMR element according to another embodiment of the present invention will be described below with reference to FIG. 3.

Figure 3:
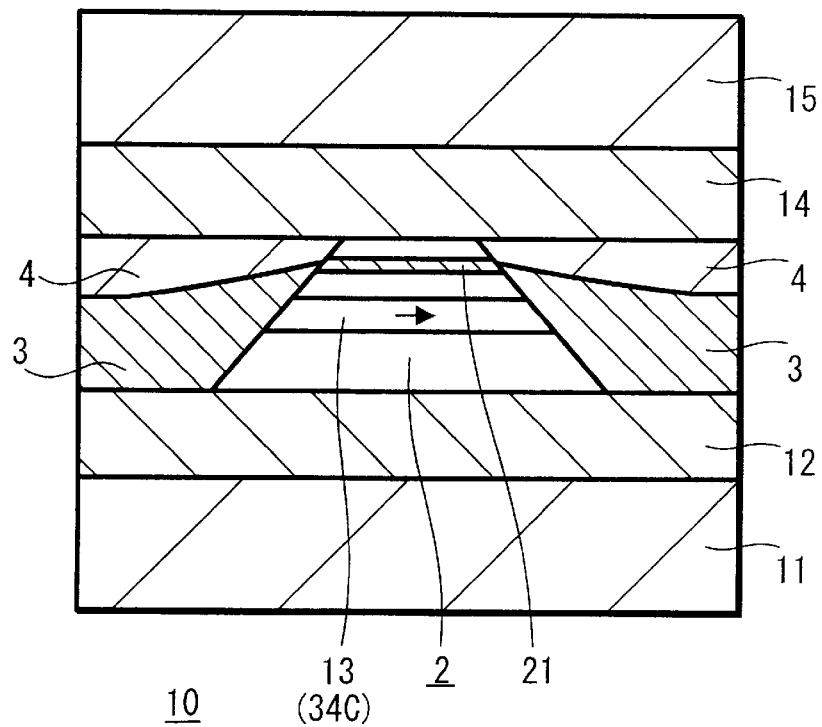
FIG. 3 is a schematic cross-sectional view showing a CPP type GMR element according to another embodiment of the present invention.

FIG. 3 is a schematic cross-sectional view showing the CPP type GMR element according to another embodiment of the present invention.

As shown in FIG. 3, this CPP type GMR element 10 uses the GMR element 2 in which the present invention is applied to the dual spin type GMR element 43 shown in FIG. 1C. This CPP type GMR element 10 is comprised of the lamination layer film including the ferromagnetic films (magnetization fixed layers 32C, 36C and magnetization free layer 34C), the nonmagnetic films (nonmagnetic conductive films) 33C, 35C and the antiferromagnetic films 31C, 37C similarly to the GMR element 43 shown in FIG. 1C and thereby formed as the trapezoid-like shape (so-called abutment-like shape).

Then, the magnetization free layer 13 corresponding to the magnetization free layer 34C shown in FIG. 1C is formed at the central portion of the GMR element 2. Further, the high-resistance layer 21 is formed above the magnetization free layer 13 within the GMR element 2.

According to this embodiment, the high-resistance layer 21 is disposed between the antiferromagnetic film 37C of the uppermost layer of the dual spin type GMR element 43 and the magnetization free layer 43. For example, the high-resistance layer 21 is disposed between the antiferromagnetic layer 37C and the magnetization fixed layer 36C or the high-resistance layer 21 is disposed between the magnetization fixed layer 36 and the nonmagnetic film 35C.

Also in this embodiment, the boundary surface between the hard magnetic film 3 and the insulating layer 4 is bonded to somewhere in the high-resistance layer 21 similarly to the preceding embodiment shown in FIG. 2. However, according to this embodiment, since the high-resistance layer 21 and the magnetization free layer 13 are located above the GMR element 2 as compared with those of FIG. 2, the thickness of the hard magnetic film 3 is increased.

The rest of the arrangement is similar to that of the CPP type GMR element 1 of the preceding embodiment so that identical elements and parts are denoted by identical reference numerals and need not be described.

According to the CPP type GMR element 10 of this embodiment, since the path of the sense current can be confined within the high-resistance layer 21 by the insulating layers 4 disposed at the right and left of the high-resistance layer 21, similarly to the preceding embodiment, the resistance of the GMR element 2 can be increased. Therefore, the giant magneto-resistive effect element according to this embodiment becomes able to record data at high recording density and is also able to produce a high output.

In the configuration of the CPP type GMR element 10 according to this embodiment, the boundary surface between the hard magnetic film 3 and the insulating layer 4 can further be shifted to the side of the magnetization free layer 13 so that the insulating layer 4 can be bonded to the whole of the high-resistance layer 21.

Next, a CPP type GMR element according to further another embodiment of the present invention will be described below with reference to FIG. 4.

Figure 4:
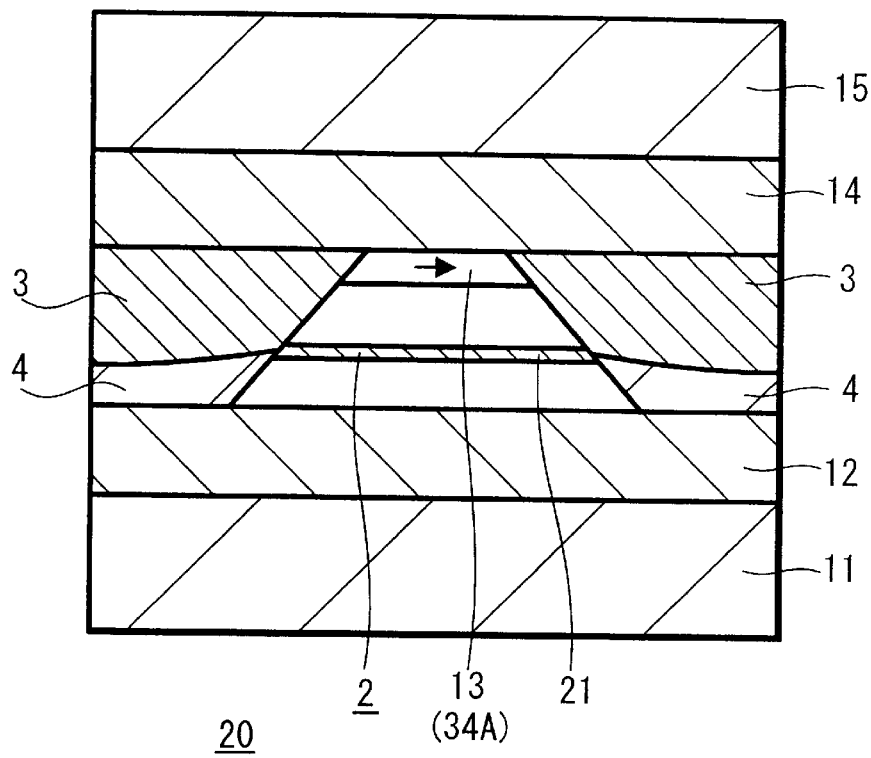
FIG. 4 is a schematic cross-sectional view showing a CPP type GMR element according to other embodiments of the present invention.

FIG. 4 is a schematic cross-sectional view showing a CPP type GMR element according to this embodiment.

As shown in FIG. 4, this CPP type MR element 20 uses the GMR element 20 in which the present invention is applied to the bottom spin type GMR element 41 shown in FIG. 1A. This CPP type MR element 20 is comprised of the lamination layer film including the ferromagnetic films (magnetization fixed layer 32A and the magnetization free layer 34A), the nonmagnetic film (nonmagnetic conductive film) 33A and the antiferromagnetic film 31A similarly to the GMR element 41 shown in FIG. 1A and is shaped like a trapezoid (so-called abutment).

Then, the magnetization free layer 13 equivalent to the magnetization free layer 34A shown in FIG. 1A is disposed at the uppermost portion of the GMR element 2. Further, the high-resistance layer 21 is formed below the magnetization free layer 13 within the GMR element 2.

According to this embodiment, the high-resistance layer 21 is disposed between the antiferromagnetic film 31A located at the lowermost layer of the bottom spin type GMR element 41 and the magnetization free layer 34A. For example, the high-resistance layer 21 is disposed between the antiferromagnetic film 31A and the magnetization fixed layer 32 or the high-resistance layer 21 is disposed between the magnetization fixed layer 32A and the nonmagnetic film 33A.

Also in this embodiment, the boundary surface between the hard magnetic film 3 and the insulating layer 4 is bonded to somewhere in the high-resistance layer 21 similarly to the preceding embodiment shown in FIG. 2.

However, according to this embodiment, the hard magnetic film 3 and the insulating layer 4 are laminated with each other in the order reverse to that of FIG. 2 and hence the hard magnetic layer 3 is formed on the insulating layer 4.

The rest of the arrangement is similar to that of the CPP type GMR element 1 of the preceding embodiment so that identical elements and parts are denoted by identical reference numerals and need not be described.

According to the CPP type GMR element 20 of this embodiment, since the path of the sense current can be confined within the high-resistance layer 21 by the insulating layers 4 disposed at the right and left of the high-resistance layer 21, similarly to the preceding embodiment, the resistance of the GMR element 2 can be increased. Therefore, the giant magneto-resistive effect element according to this embodiment becomes able to record data at a high recording density and is also able to produce a high output.

In the configuration of the CPP type GMR element 20 according to this embodiment, the boundary surface between the hard magnetic film 3 and the insulating layer 4 can further be shifted to the side of the magnetization free layer 13 (shifted in the upper direction in this embodiment) so that the insulating layer 4 can be bonded to the whole of the high-resistance layer 21.

While the high-resistance layer 21 is disposed at one place within the lamination layer film of the GMR element 2 in the above-mentioned respective embodiments, the present invention is not limited thereto and the high-resistance layer 21 may be disposed at more than two places within the lamination layer film.

When the present invention is applied to the top spin type GMR element 42 shown in FIG. 1B, for example, the high-resistance layers 21 may be disposed between the antiferromagnetic film 31B and the magnetization fixed layer 32B and between the magnetization fixed layer 32B and the nonmagnetic film 33B.

In this case, the boundary surface between the hard magnetic film 3 and the insulating layer 4 may be shifted from the high-resistance layer (e.g., high-resistance layer disposed between the magnetization fixed layer 32B and the nonmagnetic film 33B in FIG. 1B) nearer the magnetization free layer 13, of the two high-resistance layers 21, and bonded to the magnetization free layer 13.

Further, when the present invention is applied to the dual spin type GMR element 43 shown in FIG. 1C, the high-resistance layers may be disposed above and below the magnetization free layer 34C located at the central portion of the GMR element, which will be described below with reference to FIG. 5.

Figure 5:
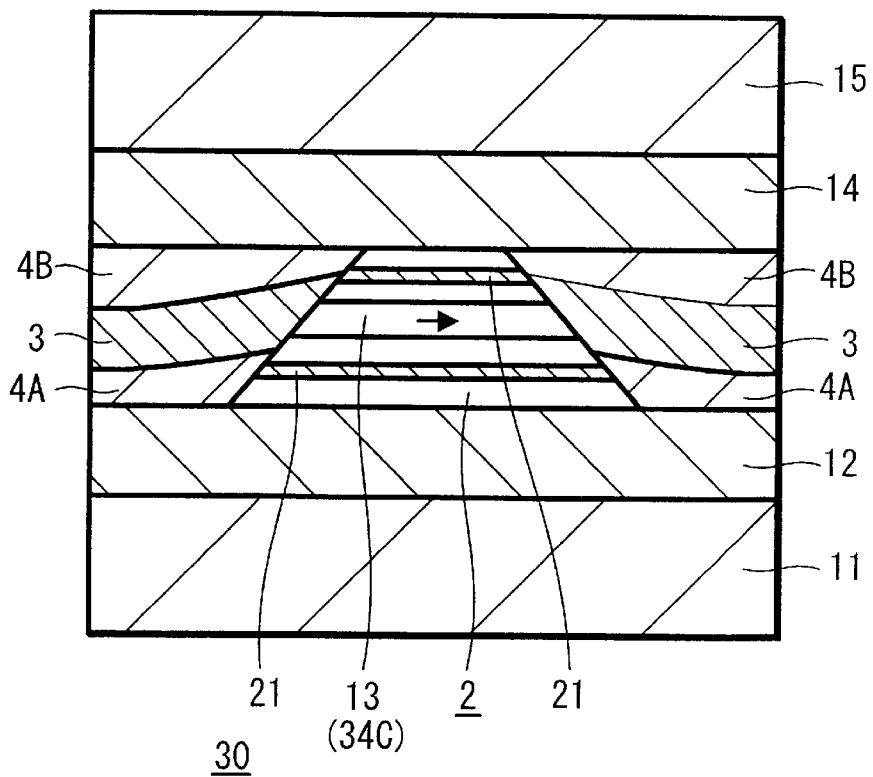
FIG. 5 is a schematic cross-sectional view showing a CPP type GMR element according to a further another embodiment of the present invention.

FIG. 5 is a schematic cross-sectional view showing a CPP type GMR element according to a further embodiment of the present invention.

As shown in FIG. 5, this CPP type GMR element 30 uses the GMR element 2 in which the present invention is applied to the dual spin type GMR element 43 shown in FIG. 1C. This CPP type GMR element 30 is comprised of the lamination layer film including the ferromagnetic films (magnetization fixed layers 32C, 36C and magnetization free layer 34C), the nonmagnetic films (nonmagnetic conductive films) 33C, 35C and the antiferromagnetic films 31C, 37C similarly to the GMR element 43 shown in FIG. 1C and is shaped like the trapezoid (so-called abutment).

Then, the magnetization free layer 13 equivalent to the magnetization free layer 34C shown in FIG. 1C is disposed at the central portion of the GMR element 2. Further, the high-resistance layers 21 are respectively formed above and below the magnetization free layer 13 within the GMR element 2 and hence there are provided the two high-resistance layers 21.

According to this embodiment, the high-resistance layers 21 are disposed at the position between the antiferromagnetic film 31C located at the lowermost layer of the bottom spin type GMR element 41 and at the position between the antiferromagnetic film 37C located at the uppermost layer and the magnetization free layer 34C. For example, the high-resistance layers 21 are located between the antiferromagnetic films 31C, 37C and the magnetization fixed layers 32C, 36C and between the magnetization fixed layers 32C, 36C and the nonmagnetic films 33C, 35C, respectively.

In this embodiment, near the right and left hard magnetic films 3 of the GMR element 2, the hard magnetic film 3 is formed on the insulating layer 4A of the lower layer, the hard magnetic film 3 is covered with the insulating layer 4B of the upper layer and the hard magnetic film 3 is sandwiched between the insulating layers 4A and 4B of the two layers.

Further, the boundary surface between the hard magnetic film 3 and the insulating layer 4B of the upper layer is bonded to somewhere in the high-resistance layer 21 of the upper layer.

However, the boundary surface between the hard magnetic film 3 and the insulating layer 4A of the lower layer is shifted from the high-resistance layer 21 of the lower layer and thereby bonded to the side of the magnetization free layer 13, whereby the insulating layer 4A of the lower layer is bonded to the whole of the high-resistance layer 21 of the lower layer. The reason for this will be described below. Since the high-resistance layer 21 of the lower layer is disposed below the lamination layer film of the GMR element 2 in FIG. 5, when the boundary between the hard magnetic film 3 and the insulating layer 4A of the lower layer is bonded to the portion above the high-resistance layer 21 rather than somewhere in the high-resistance layer 21, the insulating layer 4A of the lower layer can be deposited with ease.

The present invention is not limited to the above-mentioned configuration and can be modified in such a manner that the boundary between the hard magnetic film 3 and the insulating layer 4A of the lower layer may be shifted downwardly and bonded to somewhere in the high-resistance layer 21 of the lower layer.

The rest of the arrangement is similar to that of the CPP type GMR element 1 of the preceding embodiment so that identical elements and parts are denoted by identical reference numerals and need not be described.

According to the CPP type GMR element 30 of this embodiment, the path of the sense current can be confined within the respective high-resistance layers 21 by the insulating layers 4A and 4B bonded to the right and left of the two high-resistance layers 21. As a result, similarly to the preceding respective embodiments, the resistance of the GMR element 2 can be increased. Therefore, the giant magneto-resistive effect element according to this embodiment becomes able to record data at a high recording density and is also able to produce a high output.

In the configuration of the CPP type GMR element 30 according to this embodiment, the boundary surface between the hard magnetic film 3 and the insulating layer 4 of the upper layer can further be shifted to the side of the magnetization free layer 13 so that the insulating layer 4 can be bonded to the whole of the high-resistance layer 21 of the upper layer.

In any of the CPP type GMR elements 1, 10, 20 and 30 according to the above-mentioned respective embodiments, although the upper surface of the GMR element 2 and the uppermost surfaces of the left and right layers of the GMR element 2, i.e., the upper surfaces of the insulating layer 4 or the hard magnetic film 3 or the insulating layer 4B of the upper layer are substantially flush with each other and the upper gap film 14 is formed on a substantially flat surface, the upper gap film 14 need not always be formed on a substantially flat surface.

When the uppermost layers of the left and right layers of the GMR element 2 are the insulating layers 4 or the insulating layers 4B of the upper layer, these insulating layers 4A or 4B may be formed across the GMR element 2 and the upper gap film 14 and the GMR element 2 may electrically be connected with each other through an opening defined between the left and right insulating layer 4 or 4B.

The giant magneto-resistive effect element (GMR element) according to the present invention can be applied to the magneto-resistive effect type head (GMR head) including the giant magneto-resistive effect element, the thin-film magnetic memory and the thin-film magnetic sensor.

When the present invention is applied the magneto-resistive effect type head including the magneto-resistive effect element (GMR head), similarly to the structures of the CPP type GMR elements 1, 10, 20 and 30 of which the cross-sectional views are shown in FIGS. 2 to 5, upper and lower magnetic shields are disposed so as to sandwich the giant magneto-resistive effect element (GMR element) through a gap film made of a nonmagnetic conductive material.

Then, the magnetization direction of the magnetization free layer of the GMR element is changed by the signal magnetic field generated in response to recorded information from the recording layer of the recording medium (magnetic recording medium), e.g., magnetic layer, whereby the resistance of the GMR element is changed. Consequently, it becomes possible to output (reproduce) recorded information from the recording medium as a signal output.

Figure 6:
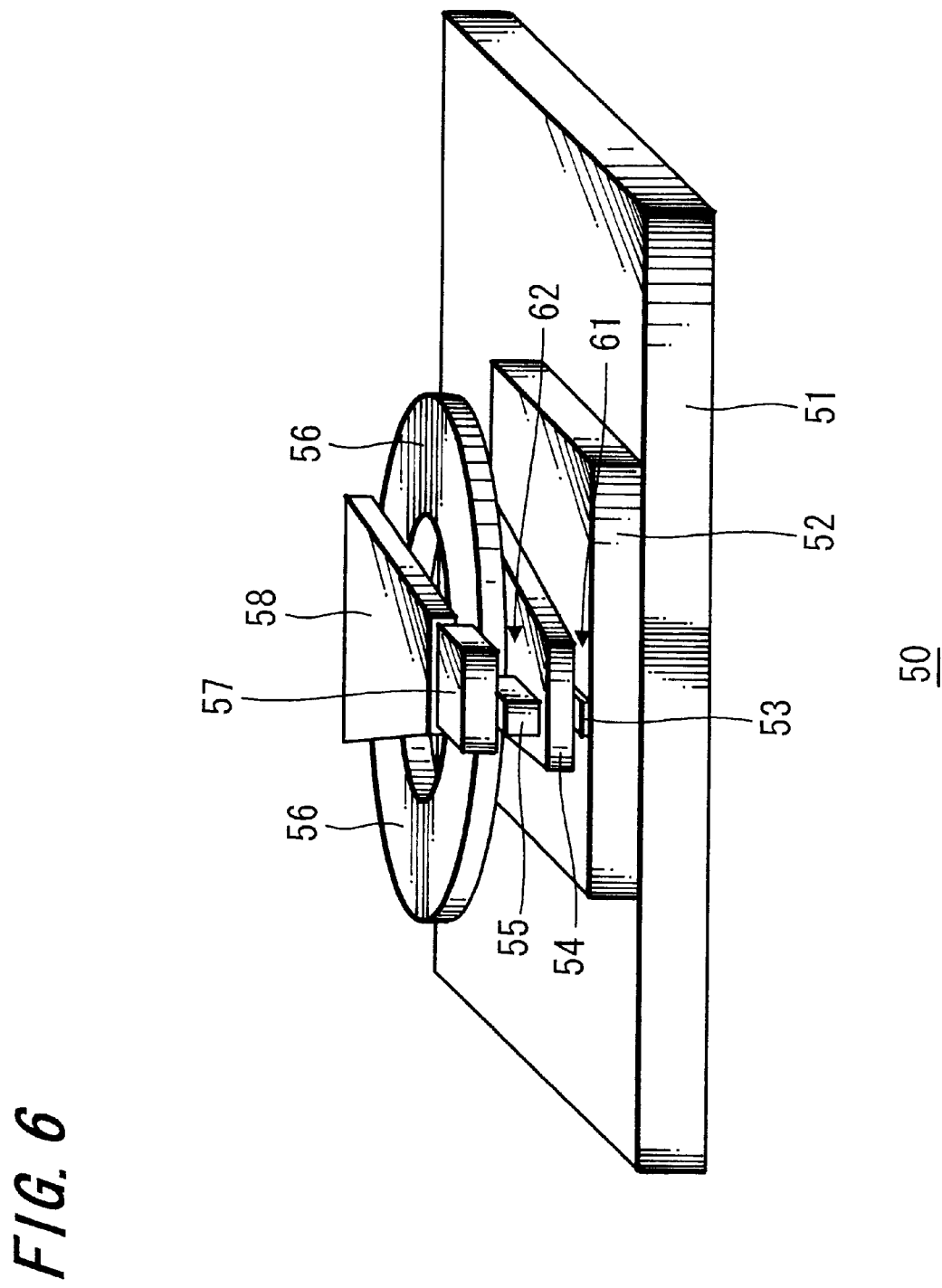
FIG. 6 is a schematic perspective view showing an arrangement of a merge type combined magnetic head.

The GMR head including the giant magneto-resistive effect element according to the present invention as described above can be used as a magneto-resistive effect type head of a lower layer of a merge type combined magnetic head 50 of which the schematic perspective view is illustrated in FIG. 6, for example. In FIG. 6, gap films and insulating films are not shown.

As shown in FIG. 6, a magnetic sensing element 53 is disposed on a lower shield 52 made of a magnetic material and which is formed on a substrate 51. Further, an upper shield 54 made of a magnetic material is formed on the upper layer.

The lower shield 52, the magnetic sensing element 53 and the upper shield 54 constitute a read magnetic head 61 serving as a lower layer head. As the magnetic sensing element 53, there is used an element having a magneto-resistive effect, i.e., magneto-resistive effect element (MR element).

The upper shield 54 serves as the lower layer magnetic core of the recording upper layer head as well and a tip end pole portion 55 is disposed above the upper shield 54. An upper layer magnetic core 57 is interconnected to the upper portion of the tip end pole portion 55. Further, a back yoke 58 is interconnected to the rear portion of the upper layer magnetic core 54. Then, a coil 56 is disposed between the lower layer magnetic core 54, the upper layer magnetic core 57 and the back yoke 58 through an insulating layer (not shown).

The lower layer magnetic core 54, the coil 56, the tip end pole portion 55, the upper layer magnetic core 57 and the back yoke 58 constitute an induction type write magnetic head 62 which serves as the upper layer head.

Then, the merge type combined magnetic head 50 is configured by laminating the lower layer read magnetic head 61 and the upper layer write magnetic head 62 with each other.

As described above, as the magneto-resistive effect type head comprising the lower layer read magnetic head 61 of this combined magnetic head 50, there can be used the magneto-resistive effect type head (GMR head) to which the magneto-resistive effect element according to the present invention is applied.

With the application of the giant magneto-resistive effect element according to the present invention, since the giant magneto-resistive effect element, i.e., the lamination layer film includes the high-resistance layer laminated thereon, the hard magnetic film and the insulating layer are directly bonded to the respective outsides of the lamination layer film and the hard magnetic film is shifted from the high-resistance layer and bonded nearer the magnetization free layer, the path of the sense current is confined by the insulating layer such that the sense current may flow through the high-resistance layer. As a result, it is possible to decrease the loss of the current shunted to the hard magnetic film.

When the current is shunted and lost so that the output is lowered, the error rate in the magneto-resistive effect type head does not fall within a prescribed value and the operation of the magneto-resistive effect type head becomes unstable. Accordingly, since the loss of the shunted current can be decreased, the output of the magneto-resistive effect type head can be increased and the magneto-resistive effect type head which outputs the signal in response to the signal magnetic field from the recording medium can be operated at a high stability.

In general, in the magneto-resistive effect type head, since it is to be understood that the output can be increased in response to the dimension of the track width and the like, the output of the magneto-resistive effect type head according to the present invention can be increased. Therefore, even when the dimension of the track width and so forth are reduced, the magneto-resistive effect type head according to the present invention can produce an output substantially equal to that of the related-art magneto-resistive effect type head.

Therefore, even when the track width is reduced, the magneto-resistive effect type head according to the present invention becomes able to cope with a recording medium of a high recording density.

Since the sense current necessary for obtaining the same output can be reduced, a consumed current can be decreased. Moreover, since heat generated due to the current can be suppressed and the magneto-resistive effect type head can be made more reliable from an electromigration-proof standpoint, the manufacturing cost of the magneto-resistive effect type head can be reduced and the yield in manufacturing the magneto-resistive effect type head can be increased.

Further, since the hard magnetic film is directly connected to the magnetization free layer, the magnetization of the magnetization free layer can be stabilized more effectively by the hard magnetic film. Accordingly, from this standpoint, the magneto-resistive effect type head which outputs the signal in response to the signal magnetic field from the recording medium can be operated at a high stability.

Figure 7A:
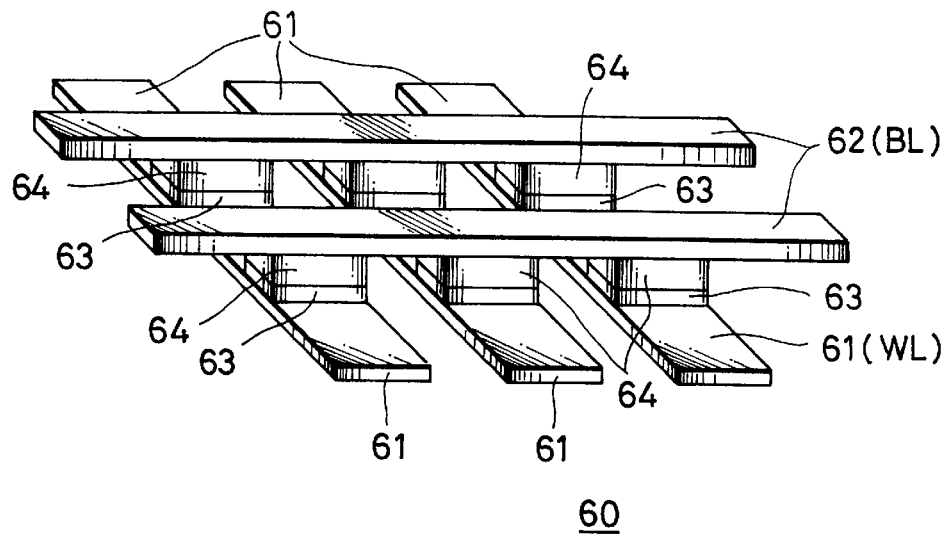
FIG. 7A is a perspective view schematically showing an arrangement of a thin-film magnetic memory according to an embodiment of the present invention and to which the giant magneto-resistive effect element according to the present invention is applied.
Figure 7B:
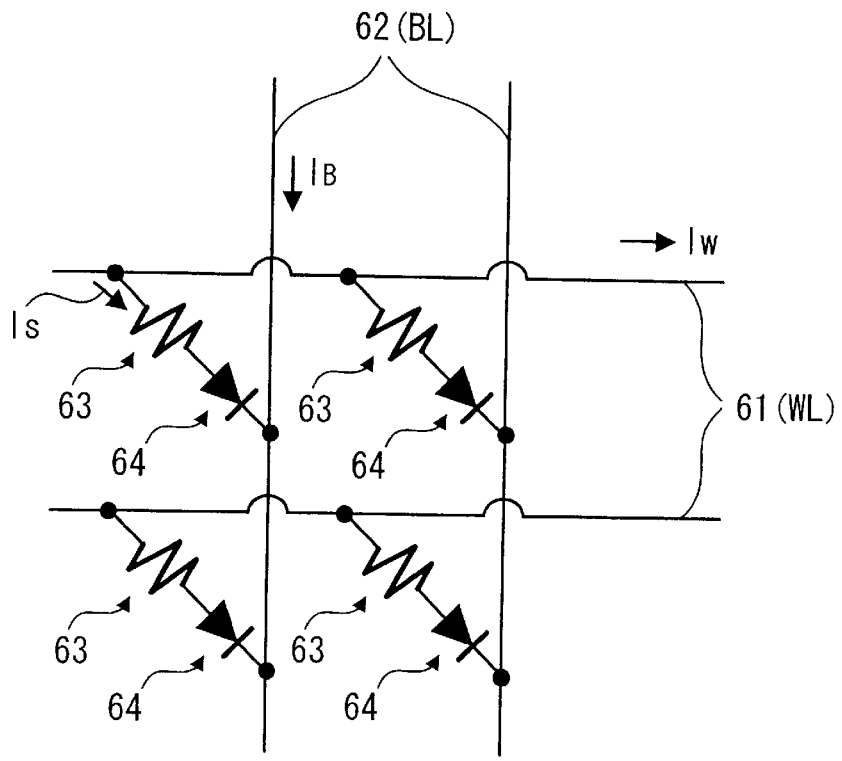
FIG. 7B is a schematic diagram showing a circuit arrangement of the thin-film magnetic memory according to the present invention.

FIGS. 7A and 7B a thin-film magnetic memory according to the present invention to which the giant magneto-resistive effect element according to the present invention is applied. Specifically, FIG. 7A is a perspective view showing a schematic arrangement of an element of the thin-film magnetic memory, and FIG. 7B is a schematic diagram showing a circuit arrangement of the element of the thin-film magnetic memory.

As illustrated, this thin-film magnetic memory 60 includes a memory cell disposed in response to a junction between a word line (WL) 61 and a bit line (BL) 62. The thin-film magnetic memory 60 is comprised of a large number of memory cells disposed in a matrix fashion.

As illustrated, the above-mentioned memory cell includes a CPP type GMR element 63 and a diode 64 formed of an amorphous silicon film. The CPP type GMR element 64 and the diode 64 are disposed in series, the CPP type GMR element 63 is interconnected to the word line 61 and the diode 64 is interconnected to the bit line 62. A current $I_s$ which flows through the CPP type GMR element 63 is restricted by the diode 64 so that the current $I_s$ may flow from the word line 61 to the bit line 62.

With the above-mentioned arrangement, the direction of the magnetization of the magnetization free layer of the CPP type GMR element 63 is inverted by a synthesized magnetic field of a current magnetic field based upon a current $I_W$ which flows in the word line 61 and a current magnetic field based upon a current $I_B$ which flows in the bit line 62 and this magnetization direction can be recorded as information of "1" or "0". When recorded information is read out from the memory cell, the magnetization direction of the magnetization free layer, i.e., contents of information can be read out from the memory cell based upon the magnitude of the sense current $I_s$ flowing through the CPP type GMR element 63 by effectively utilizing the GMR effect (giant magneto-resistive effect).

Although the current magnetic fields of both of the word line 61 and the bit line 62 are applied to the selected cell so that the magnetization direction of the magnetization free layer is inverted, the current magnetic field of any one of the word line 61 and the bit line 62 is applied to the memory cell, which is not selected, and hence the magnetization direction cannot be inverted. As a result, information can be recorded on only the selected memory cell.

As the CPP type GMR element 63, there can be used the giant magneto-resistive effect element according to the present invention, i.e., the giant magneto-resistive effect element in which the lamination layer film is laminated including the high-resistance layer, the hard magnetic film and the insulating layer are directly connected to both outsides of the lamination layer film and the hard magnetic layer is shifted from the high-resistance layer and bonded nearer the magnetization free layer.

As a consequence, since the hard magnetic film is shifted from the high-resistance layer and bonded nearer the magnetization free layer and the insulating layers is bonded to both outsides of at least part of the high-resistance layer, the current path can be confined in such a manner that the current may flow to the high-resistance layer of the CPP type GMR element 63. Thus, the loss of the current shunted to the hard magnetic film can be decreased.

Accordingly, it becomes possible to decrease the current $I_W$ flowing through the word line 61 and the current $I_B$ flowing through the bit line 62, both of which are necessary for writing and reading information in and out of the memory cell. As a result, since the consumed current can be decreased and heat generated due to the current can be suppressed so that the thin-film magnetic memory becomes highly reliable from a view point of an electromigration-proof, the manufacturing cost of the thin-film magnetic memory can be reduced and the yield in manufacturing the thin-film magnetic memory can be improved.

Further, since the hard magnetic film is directly connected to the magnetization free layer, the magnetization of the magnetization free layer can be stabilized more effectively by the hard magnetic film, and hence the thin-film magnetic memory for writing and reading information in and out of the memory cell can be operated at a high stability.

When the giant magneto-resistive effect element according to the present invention is applied to the thin-film magnetic sensor, similarly to the CPP type GMR elements 1, 10, 20 and 30 shown in FIGS. 2 to 5, the giant magneto-resistive effect element (GMR) element has a configuration in which it is sandwiched by upper and lower magnetic shields through a gap film made of a nonmagnetic conductive material. To be concrete, the giant magneto-resistive effect element has a configuration similar to the lower layer read magnetic head 61 of the combined magnetic head 50 shown in FIG. 6, for example.

While the magneto-resistive effect type head is adapted to detect the signal magnetic field corresponding to the information recorded on the recording layer of the recording medium, the thin-film magnetic sensor is adapted to detect other general external magnetic fields.

If a magnetic shield, for example, has a shape suitable for detecting an external magnetic field, then the thin-film magnetic sensor becomes able to detect an external magnetic field at a high efficiency.

With the application of the giant magneto-resistive effect element according to the present invention, since the lamination layer film is laminated including the high-resistance layer, the hard magnetic film and the insulating layer are directly connected to both outsides of the lamination layer film and the hard magnetic film is shifted from the high-resistance layer and bonded nearer the magnetization free layer, the current path is restricted by the insulating layer in such a manner that the sense current may flow to the high-resistance layer. Thus, the loss of the current shunted to the hard magnetic film can be decreased.

Since the loss of the current shunted to the hard magnetic film can be decreased so that the output of the giant magneto-resistive effect element can be increased, it is possible to realize the thin-film magnetic sensor which can increase the output.

As a result, the thin-film magnetic sensor becomes able to detect a smaller external magnetic field, and hence it becomes possible to improve the sensitivity of the thin-film magnetic sensor.

Further, since the sense current necessary for obtaining the same output can be decreased, it becomes possible to decrease the consumed current. Also, since heat generated due to the current is suppressed and the thin-film magnetic sensor becomes highly reliable from a view point of an electromigration-proof, the manufacturing cost of the thin-film magnetic sensor can be reduced, and the yield obtained when the thin-film magnetic sensor is manufactured can be increased.

Furthermore, since the hard magnetic film is directly connected to the magnetization free layer, the magnetization of the magnetization free layer can be stabilized more effectively by the hard magnetic film, and hence the magneto-resistive effect type sensor for outputting a signal in response to an external magnetic field can be operated stably.

According to the present invention, since the loss of the current shunted to the hard magnetic film can be suppressed and the path of the sense current can be confined within the high-resistance layer, the output can be increased.

Accordingly, the magneto-resistive effect type head, the thin-film magnetic memory and the thin-film magnetic sensor, each of which includes the giant magneto-resistive effect element, become able to increase the output. Moreover, in the magneto-resistive effect type head including the giant magneto-resistive effect element, the dimension of the track width and so forth necessary for obtaining the same output can be reduced, and hence this magneto-resistive effect type head becomes able to cope with the recording medium having the high recording density.

Further, since the resistance of the giant magneto-resistive effect element can be increased by the high-resistance layer, the giant magneto-resistive effect element becomes able to cope with the high recording density. From this standpoint, the magneto-resistive effect type head including the giant magneto-resistive effect element becomes able to cope with the recording medium having the high recording density.

Moreover, according to the present invention, since the hard magnetic film is directly bonded to the magnetization free layer of the giant magneto-resistive effect element, the hard magnetic film is approached to the giant magneto-resistive effect element, whereby the giant magneto-resistive effect element can be stabilized more reliably and the resistance change of the giant magneto-resistive effect element can be stabilized.

Accordingly, the magneto-resistive effect type head, the thin-film magnetic memory and the thin-film magnetic sensor, each of which includes the giant magneto-resistive effect element, can carry out stable operations (output of signal and write and read of information) based upon the resistance change of the giant magneto-resistive effect element.

Furthermore, according to the present invention, since the sense current necessary for obtaining the same output can be decreased, it becomes possible to decrease the consumed current. At the same time, from the standpoint of the electromigration and so forth, the reliability, the service life and the manufacturing yield of the giant magneto-resistive effect element and the magneto-resistive effect type head, the thin-film magnetic memory and the thin-film magnetic sensor, each of which includes the giant magneto-resistive effect element can be improved. As a consequence, it becomes possible to decrease the manufacturing cost.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A giant magneto-resistive effect element comprising a lamination layer film including a ferromagnetic film, a nonmagnetic film and an antiferromagnetic film and in which said ferromagnetic film includes a magnetization free layer and a magnetization fixed layer and a current is restricted by an upper electrode and a lower electrode so that said current flows to the direction perpendicular to the film plane of said lamination layer film, wherein said lamination layer film is laminated including a high-resistance layer, a hard magnetic film made of a conductive hard magnetic material and an insulating layer are directly bonded to respective outsides of said lamination layer film along its width direction and said hard magnetic film is shifted from said high-resistance layer and bonded nearer said magnetization free layer.

2. A magneto-resistive effect type head including a giant magneto-resistive effect element comprising a lamination layer film which includes a ferromagnetic film, a nonmagnetic film and an antiferromagnetic film, and in which said ferromagnetic film includes a magnetization free layer and a magnetization fixed layer and a current is restricted by an upper electrode and a lower electrode so that said current flows to the direction perpendicular to the film plane of said lamination layer film, said lamination layer film is laminated including a high-resistance layer, a hard magnetic film made of a conductive hard magnetic material and an insulating layer are directly bonded to respective outsides of said lamination layer film along its width direction and said hard magnetic film is shifted from said high-resistance layer and bonded nearer said magnetization free layer, wherein upper and lower magnetic shields are disposed so as to sandwich said giant magneto-resistive effect element through a gap film made of a nonmagnetic conductive material, said gap film and said magnetic shields constitute said upper electrode and said lower electrode and said upper electrode, said lower electrode and said lamination layer film are connected to each other electrically.

3. A thin-film magnetic memory including a bit line, a word line and a giant magneto-resistive effect element comprising a lamination layer film which includes a ferromagnetic film, a nonmagnetic film and an antiferromagnetic film and in which said ferromagnetic film includes a magnetization free layer and a magnetization fixed layer and a current is restricted by an upper electrode and a lower electrode so that said current flows to the direction perpendicular to the film plane of said lamination layer film, said lamination layer film is laminated including a high-resistance layer, a hard magnetic film made of a conductive hard magnetic material and an insulating layer are directly bonded to respective outsides of said lamination layer film along its width direction and said hard magnetic film is shifted from said high-resistance layer and bonded nearer said magnetization free layer, wherein a memory cell including said giant magneto-resistive effect element is disposed so as to oppose to a crossing between said bit line and said word line.

4. A thin-film magnetic sensor including a giant magneto-resistive effect element comprising a lamination layer film including a ferromagnetic film, a nonmagnetic film and an antiferromagnetic film, said ferromagnetic film includes a magnetization free layer and a magnetization fixed layer and a current is restricted by an upper electrode and a lower electrode so that said current flows to the direction perpendicular to the film plane of said lamination layer film, said lamination layer film is laminated including a high-resistance layer, a hard magnetic film made of a conductive hard magnetic material and an insulating layer are directly bonded to respective outsides of said lamination layer film along its width direction and said hard magnetic film is shifted from said high-resistance layer and bonded nearer said magnetization free layer, wherein upper and lower magnetic shields are disposed so as to sandwich said giant magneto-resistive effect element through a gap film made of a nonmagnetic conductive material, said gap film and said magnetic shields constitute said upper electrode and said lower electrode and said upper electrode, said lower electrode and said lamination layer film are connected to each other electrically.

* * * * *